(12) United States Patent
Romanelli et al.

(10) Patent No.: US 9,200,198 B1
(45) Date of Patent: *Dec. 1, 2015

(54) INORGANIC PHOSPHOR AND LIGHT EMITTING DEVICES COMPRISING SAME

(71) Applicants: Lightscape Materials, Inc., Princeton, NJ (US); Dow Global Technologies LLC, Midland, MI (US)

(72) Inventors: Michael Dennis Romanelli, East Brunswick, NJ (US); Mary Anne Leugers, Midland, MI (US); Alan C. Thomas, Yardley, PA (US); Yongchi Tian, Princeton Junction, NJ (US)

(73) Assignees: Lightscape Materials, Inc., Princeton, NJ (US); Dow Global Technologies LLC, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/471,571

(22) Filed: Aug. 28, 2014

(51) Int. Cl.
*C09K 11/77* (2006.01)
*H01L 33/50* (2010.01)

(52) U.S. Cl.
CPC .......... *C09K 11/7734* (2013.01); *H01L 33/504* (2013.01)

(58) Field of Classification Search
CPC . C09K 11/7734; H01L 33/502; H01L 33/504
See application file for complete search history.

(56) References Cited

U.S. PATENT DOCUMENTS

| | | | |
|---|---|---|---|
| 7,138,756 B2 | 11/2006 | Gotoh et al. | |
| 7,252,788 B2 | 8/2007 | Nagatomi et al. | |
| 7,258,816 B2 | 8/2007 | Tamaki et al. | |
| 7,273,568 B2 | 9/2007 | Nagatomi et al. | |
| 7,391,060 B2 | 6/2008 | Oshio | |
| 7,432,647 B2 | 10/2008 | Nagatomi et al. | |
| 7,445,730 B2 | 11/2008 | Nagatomi et al. | |
| 7,476,335 B2 | 1/2009 | Sakane et al. | |
| 7,476,338 B2 | 1/2009 | Sakane et al. | |
| 7,556,744 B2 | 7/2009 | Tamaki et al. | |
| 7,597,823 B2 | 10/2009 | Tamaki et al. | |
| 7,713,443 B2 | 5/2010 | Hirosaki et al. | |
| 7,723,740 B2 | 5/2010 | Takashima et al. | |
| 7,811,472 B2 | 10/2010 | Oshio | |
| 7,902,564 B2 | 3/2011 | Mueller-Mach et al. | |
| 7,938,983 B2 | 5/2011 | Mueller-Mach et al. | |
| 7,964,113 B2 | 6/2011 | Tamaki et al. | |
| 8,007,683 B2 | 8/2011 | Starick et al. | |
| 8,105,502 B2 | 1/2012 | Fukuda et al. | |
| 8,119,028 B2 | 2/2012 | Le Toquin | |
| 8,148,887 B2 | 4/2012 | Hirosaki et al. | |
| 8,159,126 B2 | 4/2012 | Schmidt et al. | |
| 8,206,611 B2 | 6/2012 | Hirosaki et al. | |
| 8,535,566 B2 | 9/2013 | Li et al. | |
| 8,536,777 B2 | 9/2013 | Li et al. | |
| 8,551,360 B2 | 10/2013 | Duan et al. | |
| 8,704,255 B2 | 4/2014 | Kim et al. | |
| 8,815,121 B2 | 8/2014 | Li et al. | |
| 2007/0007494 A1 | 1/2007 | Hirosaki et al. | |
| 2009/0283721 A1 | 11/2009 | Liu et al. | |
| 2010/0213489 A1 | 8/2010 | Kim et al. | |
| 2010/0213822 A1 | 8/2010 | Shimooka et al. | |
| 2010/0288972 A1 | 11/2010 | Roesler et al. | |
| 2011/0176084 A1* | 7/2011 | Akiho et al. | 349/61 |
| 2011/0204769 A1 | 8/2011 | Fukuda et al. | |
| 2011/0279016 A1 | 11/2011 | Li et al. | |
| 2011/0279017 A1 | 11/2011 | Li et al. | |
| 2013/0207536 A1 | 8/2013 | Li et al. | |
| 2013/0313966 A1 | 11/2013 | Kim et al. | |
| 2014/0015400 A1* | 1/2014 | Li et al. | 313/503 |
| 2014/0062287 A1 | 3/2014 | Li et al. | |
| 2014/0062288 A1* | 3/2014 | Li et al. | 313/503 |
| 2015/0070875 A1* | 3/2015 | Hirosaki et al. | 362/97.3 |
| 2015/0132536 A1* | 5/2015 | Lin et al. | 428/141 |

OTHER PUBLICATIONS

Copending U.S. Appl. No. 14/471,607.
Copending U.S. Appl. No. 14/471,714.

* cited by examiner

*Primary Examiner* — Mamadou Diallo
(74) *Attorney, Agent, or Firm* — Thomas S. Deibert

(57) ABSTRACT

A phosphor is provided, comprising an inorganic luminescent compound represented by formula (1) having an emission spectrum resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, a peak 1 peak wavelength, $P\lambda_{P1}$, and a peak 1 area, $A_{P1}$; wherein the second Gaussian emission curve has a second Gaussian emission curve peak, $P_2$; wherein the second Gaussian emission curve peak, $P_2$ has a peak 2 height, $H_{P2}$, a peak 2 peak wavelength, $P\lambda_{P2}$, a peak 2 full width at half max, $FWHM_{P2}$, and a peak 2 area, $A_{P2}$; wherein $P\lambda_{P1} < P\lambda_{P2}$; and, wherein, at least one of, the peak 2 height, $H_{P2}$, the peak 2 full width at half max, $FWHM_{P2}$, and, the peak 2 area, $A_{P2}$, is minimized.

10 Claims, No Drawings

INORGANIC PHOSPHOR AND LIGHT EMITTING DEVICES COMPRISING SAME

The present invention relates to an inorganic phosphor and its use in lighting applications, particularly in phosphor converted light emitting diode lighting devices. More particularly, the present invention relates to a phosphor, comprising an inorganic luminescent compound represented by formula (1) having an emission spectrum resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, a peak 1 peak wavelength, $P\lambda_{P1}$, and a peak 1 area, $A_{P1}$; wherein the second Gaussian emission curve has a second Gaussian emission curve peak, $P_2$; wherein the second Gaussian emission curve peak, $P_2$, has a peak 2 height, $H_{P2}$, a peak 2 peak wavelength, $P\lambda_{P2}$, a peak 2 full width at half max, $FWHM_{P2}$, and a peak 2 area, $A_{P2}$; wherein $P\lambda_{P1} < P\lambda_{P2}$; and, wherein, at least one of, (a) the peak 2 height, $H_{P2}$, is minimized; (b) the peak 2 full width at half max, $FWHM_{P2}$, is minimized; and, (c) the peak 2 area, $A_{P2}$, is minimized; and, lighting devices comprising the same.

Phosphor-converted LEDs (pcLEDs) utilize a blue LED chip as a light source and one or more phosphors to produce white light. Devices based on pcLED technology are poised to become fundamental devices for general use in solid state lighting applications. Nevertheless, significant advances are required in order to achieve the performance specifications set by the solid state lighting market.

The pcLED devices create their white light emissions from a single LED by exciting the included phosphor(s) using the emission spectrum produced by the blue LED chip. The emission spectrum produced by the blue LED chip excites the included phosphor(s) which then produce an emission spectrum that combines with that of the blue LED chip to yield white light. It is important to recognize that color tuning of the blue LED chip and the included phosphor(s) is critical for the effectiveness and optimization of the pcLED devices. Accordingly, there is a continuing need for phosphor development to provide pcLED device manufactures with enhanced color tuning capabilities.

Also, the phosphors used in conventional pcLED device designs are located in close proximity to the blue LED light source. As a result, during light generation these phosphors are subjected to elevated temperatures. The junction temperatures exhibited by high power LED chips are typically in the range of 100 to 150° C. At such elevated temperatures, the crystal of the phosphors are at a high vibrationally excited state. When placed in such a high vibrationally excited state, the excitation energy can result in the generation of additional heat through non-luminescent relaxation rather than resulting in the desired luminescence emission from the phosphor. This heat generation exacerbates the situation resulting in a vicious cycle that contributes to the inability of current pcLED devices to achieve the industry established performance specifications for the solid state lighting market. Accordingly, successful development of pcLED devices for general illumination requires the identification of phosphors that can operate highly efficiently at temperatures of 100 to 150° C.

Nitride based phosphors have been proposed for use in pcLED devices because of their excellent luminescence performance at the high temperatures developed in pcLED devices. Examples of such nitride based phosphors include metal silicon nitride based phosphors. The host crystals of these phosphor materials consist mainly of chemical bonds of Si—N, Al—N, as well as hybrid bonds thereof, as the backbone of the structure. While these bonds are stable, the chemical bond between silicon and carbon (Si—C) has a higher bond energy, and therefore higher thermal and chemical stability. Furthermore, carbon forms very stable chemical bonds with many metal atoms.

Carbidonitride phosphors can be comprised of carbon, silicon, germanium, nitrogen, aluminum, boron and other metals in the host crystal and one or more metal dopants as a luminescent activator. This class of phosphors has recently emerged as a color converter capable of converting near UV (nUV) or blue light to other light in the visible spectral range, e.g., blue, green, yellow, orange and red light. The host crystal of carbidonitride phosphors is comprised of —N—Si—C—, —N—Si—N—, and —C—Si—C— networks in which the strong covalent bonds of Si—C and Si—N serve as the main building blocks of the structure.

In certain carbidonitride phosphors, the carbon can enhance, rather than quench, the luminescence of the phosphor, in particular when the phosphor is subjected to relatively high temperatures (e.g. 200° C. to 400° C.). The reflectance of certain silicon carbidonitride phosphors in the wavelength range of the desired emission spectrum increases as the amount of carbon increases. These carbidonitride phosphors have been reported to exhibit excellent thermal stability of emission and high emission efficiency.

One family of carbidonitride based phosphors designed for use in pcLED devices is disclosed in U.S. Pat. No. 8,535,566 to Li et al. Li et al. describe stoichiometric silicon carbidonitride phosphors and light emitting devices which utilize the same, wherein the family of carbidonitride based phosphors are expressed as follows:

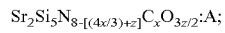

wherein $0<x\leq 5$, $0\leq z\leq 3$, and $((4x/3)+z)<8$;

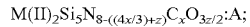

wherein $0<x\leq 5$, $0\leq z\leq 3$, and $((4x/3)+z)<8$;

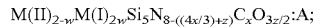

wherein $0<x\leq 5$, $0\leq w\leq 0.6$, $0\leq z\leq 3$, and $((4x/3)+z)<8$;

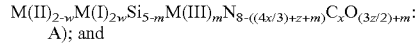

wherein $0<x\leq 5$, $0\leq w\leq 0.6$, $0\leq z\leq 3$, $0\leq m<2$, and $((4x/3)+z+m)<8$;

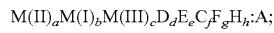

wherein $0<a<2$, $0\leq b\leq 0.6$, $0\leq c<2$, $0<d\leq 5$, $0<e\leq 8$, $0<f\leq 5$, $0\leq g<2.5$, and $0\leq h<0.5$. wherein M(II) is at least one divalent cation; wherein M(I) is at least one monovalent cation; M(III) is at least one trivalent cation; wherein D is at least one tetravalent cation; wherein E is at least one trivalent anion; wherein F is at least one divalent anion; wherein H is at least one monovalent anion; and, wherein A is a luminescence activator doped in the crystal structure.

Notwithstanding, there is a continuing need for phosphors that provide pcLED device manufactures with enhanced color tuning capabilities. Particularly, there is a continuing need for additional red phosphor offerings that exhibit tunable emission spectra having an overall emission peak wavelength of between 600 nm and 660 nm coupled with a high luminescence and low thermal quenching.

The present invention provides a phosphor, comprising: an inorganic luminescent compound represented by formula (1)

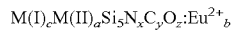           (1)

wherein M(I) is a monovalent species selected from the group consisting of Li, Na, K, F, Cl, Br and I; wherein M(II) is a divalent cation selected from the group consisting of at least one of Mg, Ca, Sr and Ba; wherein $1.7 \leq a \leq 2$; $0 < b \leq 0.1$; $0 \leq c \leq 0.1$; $5 \leq x \leq 8$; $0 \leq y \leq 1.5$; $0 \leq z \leq 5$; wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1} < P\lambda_{P2}$; wherein the emission spectrum, $ES_{455}$, has a peak ratio, $P_R$, of $\geq 1$ as determined by the following equation $$P_R = H_{P1}/H_{P2}.$$

The present invention provides a phosphor, comprising: an inorganic luminescent compound represented by formula (1)

$$M(I)_c M(II)_a Si_5 N_x C_y O_z : Eu^{2+}{}_b \tag{1}$$

wherein M(I) is a monovalent species selected from the group consisting of Li, Na, K, F, Cl, Br and I; wherein M(II) is a divalent cation selected from the group consisting of at least one of Mg, Ca, Sr and Ba; wherein $1.7 \leq a \leq 2$; $0 < b \leq 0.1$; $0 \leq c \leq 0.1$; $5 \leq x \leq 8$; $0 \leq y \leq 1.5$; $0 \leq z \leq 5$; wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve, wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1} < P\lambda_{P2}$; wherein the emission spectrum, $ES_{455}$, has a peak ratio, $P_R$, of $\geq 1$ as determined by the following equation $$P_R = H_{P1}/H_{P2}; \text{ and,}$$

wherein the second Gaussian emission curve has a full width at half max, $FWHM_{P2}$, of <100 nm.

The present invention provides a phosphor, comprising: an inorganic luminescent compound represented by formula (1)

$$M(I)_c M(II)_a Si_5 N_x C_y O_z : Eu^{2+}{}_b \tag{1}$$

wherein M(I) is a monovalent species selected from the group consisting of Li, Na, K, F, Cl, Br and I; wherein M(II) is a divalent cation selected from the group consisting of at least one of Mg, Ca, Sr and Ba; wherein $1.7 \leq a \leq 2$; $0 < b \leq 0.1$; $0 \leq c \leq 0.1$; $5 \leq x \leq 8$; $0 \leq y \leq 1.5$; $0 \leq z \leq 5$; wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$, and a peak 1 area, $A_{P1}$; wherein the second Gaussian emission curve has a second Gaussian emission curve peak, $P_2$, having a peak 2 height, $H_{P2}$, at a peak 2 peak wavelength, $P\lambda_{P2}$, and a peak 2 area, $A_{P2}$; wherein $P\lambda_{P1} < P\lambda_{P2}$; wherein the emission spectrum, $ES_{455}$, has a peak ratio, $P_R$, of $\geq 1$ as determined by the following equation $$P_R = H_{P1}/H_{P2}; \text{ and,}$$

wherein the emission spectrum, $ES_{455}$, has an area ratio, $A_R$, of $\geq 0.6$ as determined by the following equation $$A_R = A_{P1}/A_{P2}.$$

The present invention provides a phosphor, comprising: an inorganic luminescent compound represented by formula (1)

$$M(I)_c M(II)_a Si_5 N_x C_y O_z : Eu^{2+}{}_b \tag{1}$$

wherein M(I) is a monovalent species selected from the group consisting of Li, Na, K, F, Cl, Br and I; wherein M(II) is a divalent cation selected from the group consisting of at least one of Mg, Ca, Sr and Ba; wherein $1.7 \leq a \leq 2$; $0 < b \leq 0.1$; $0 \leq c \leq 0.1$; $5 \leq x \leq 8$; $0.01 \leq y \leq 1.5$; $0.01 \leq z \leq 5$; and, $y \neq z$; wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1} < P\lambda_{P2}$; wherein the emission spectrum, $ES_{455}$, has a peak ratio, $P_R$, of $\geq 1$ as determined by the following equation $$P_R = H_{P1}/H_{P2}.$$

The present invention provides a phosphor, comprising: an inorganic luminescent compound represented by formula (1)

$$M(I)_c M(II)_a Si_5 N_x C_y O_z : Eu^{2+}{}_b \tag{1}$$

wherein M(I) is a monovalent species selected from the group consisting of Li, Na, K, F, Cl, Br and I; wherein M(II) is Sr; wherein $1.7 \leq a \leq 2$; $0 < b \leq 0.1$; $0 \leq c \leq 0.1$; $5 \leq x \leq 8$; $0.01 \leq y \leq 1.5$; $0.01 \leq z \leq 5$; and, $y \neq z$; wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1} < P\lambda_{P2}$; wherein the emission spectrum, $ES_{455}$, has a peak ratio, $P_R$, of $\geq 1$ as determined by the following equation $$P_R = H_{P1}/H_{P2}.$$

The present invention provides a phosphor, comprising: an inorganic luminescent compound represented by formula (1)

$$M(I)_c M(II)_a Si_5 N_x C_y O_z : Eu^{2+}{}_b \tag{1}$$

wherein M(I) is a monovalent species selected from the group consisting of Li, Na, K, F, Cl, Br and I; wherein M(II) is a divalent cation selected from the group consisting of at least one of Mg, Ca, Sr and Ba; wherein $1.7 \leq a \leq 2$; $0 < b \leq 0.1$; $0 \leq c \leq 0.1$; $5 \leq x \leq 8$; $0 \leq y \leq 1.5$; $0 \leq z \leq 5$; wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1}<P\lambda_{P2}$; wherein the emission spectrum, $ES_{455}$, has a peak ratio, $P_R$, of ≥1 as determined by the following equation $$P_R = H_{P1}/H_{P2}; \text{ and,}$$

wherein the phosphor exhibits an emission spectrum, $ES_{453}$, upon excitation with monochromatic light having a wavelength of 453 nm; wherein the emission spectrum, $ES_{453}$, has an overall full width at half max, $FWHM_{overall}$, of <90 nm coupled with a $CIE_X$ of >0.625 based on the CIE 1931 Chromaticity Diagram.

The present invention provides a lighting apparatus comprising: a light source, wherein the light source produces light having a source luminescence spectrum; and, a first source luminescence spectrum modifier, wherein the first source luminescence spectrum modifier is a phosphor according to the present invention; wherein the phosphor is radiationally coupled to the light source.

DETAILED DESCRIPTION

The term "$ES_{455}$" as used herein and in the appended claims is the emission spectrum exhibited by a given luminescent compound (e.g, phosphor) upon excitation with monochromatic light having a wavelength of 455 nm.

The term "$ES_{453}$" as used herein and in the appended claims is the emission spectrum exhibited by a given luminescent compound (e.g., phosphor) upon excitation with monochromatic light having a wavelength of 453 nm.

The terms "first Gaussian emission curve" and "second Gaussian emission curve" as used herein and in the appended claims refer to two Gaussian emission curves resolved using GRAMS peak fitting software with 2 symmetric Gaussian bands from the emission spectrum, $ES_{455}$, exhibited by an inorganic luminescent compound generically represented by formula (1) upon excitation with monochromatic light having a wavelength of 455 nm observed using a spectrometer having a spectral resolution of ≤1.5 nm.

The term "first Gaussian emission curve peak" as used herein and in the appended claims is the peak of the first Gaussian emission curve at a higher energy relative to the second Gaussian emission curve peak.

The term "peak 1 height" or "$H_{P1}$" as used herein and in the appended claims is the height of the first Gaussian emission curve at the first Gaussian emission curve peak.

The term "peak 1 peak wavelength" or "$P\lambda_{P1}$" as used herein and in the appended claims is the wavelength corresponding to the first Gaussian emission curve peak.

The term "peak 1 area" or "$A_{P1}$" as used herein and in the appended claims is the area under the first Gaussian emission curve peak.

The term "second Gaussian emission curve peak" as used herein and in the appended claims is the peak of the second Gaussian emission curve at a lower energy relative to the first Gaussian emission curve peak.

The term "peak 2 height" or "$H_{P2}$" as used herein and in the appended claims is the height of the second Gaussian emission curve at the second Gaussian emission curve peak.

The term "peak 2 peak wavelength" or "$P\lambda_{P2}$" as used herein and in the appended claims is the wavelength corresponding to the second Gaussian emission curve peak.

The term "peak 2 full width half max" or "$FWHM_{P2}$" as used herein and in the appended claims is the full width at half max of the second Gaussian emission curve, wherein $P\lambda_{P1}<P\lambda_{P2}$.

The term "peak 2 area" or "$A_{P2}$" as used herein and in the appended claims is the area under the second Gaussian emission curve.

The term "peak ratio" or "$P_R$" as used herein and in the appended claims is the ratio of the peak 1 height, $H_{P1}$, to the peak 2 height, $H_{P2}$, as determined by the following equation $$H_R = H_{P1}/H_{P2};$$

wherein $P\lambda_{P1}<P\lambda_{P2}$.

The term "area ratio" or "$A_R$" as used herein and in the appended claims is the ratio of the peak 1 area, $A_{P1}$, to the peak 2 area, $A_{P2}$, as determined by the following equation $$A_R = A_{P1}/A_{P2};$$

wherein $P\lambda_{P1}<P\lambda_{P2}$.

The term "$CIE_X$" as used herein and in the appended claims means the x chromaticity coordinate of an emission spectrum (i.e., $ES_{455}$ or $ES_{453}$) of a luminescent compound based on the CIE 1931 Chromaticity Diagram.

The term "$CIE_Y$" as used herein and in the appended claims means the y chromaticity coordinate of an emission spectrum (i.e., $ES_{455}$ or $ES_{453}$) of a luminescent compound based on the CIE 1931 Chromaticity Diagram.

It is known that each $Eu^{2+}$ cation incorporated into an inorganic substance generically represented by formula (1) can occupy either a substitutional or interstitial position within the host lattice. For example, the $Eu^{2+}$ cations incorporated into the inorganic substance generically represented by formula (1) can substitute into the host lattice sites otherwise occupied by a M(II) divalent cation (i.e., $Mg^{2+}$, $Ca^{2+}$, $Sr^{2+}$ or $Ba^{2+}$). Such site specific substitution is a result of the $Eu^{2+}$ cation having the same oxidation state as the displaced M(II) divalent cation as well as the $Eu^{2+}$ cation having a similar ionic radii (6-coordinate $Sr^{2+}$, 1.18 Å; 6-coordinate $Eu^{2+}$, 1.17 Å).

The designers of pcLED devices are acutely aware of how the human eye responds to the electromagnetic spectrum and how that response translates into the performance and efficiency of the incorporating pcLED devices. That is, the designers of pcLED devices will recognize that the human eye will not be sensitive to emission spectrum emitted from the device that falls outside the area beneath the photopic response curve. Accordingly, these designers will recognize the desirability of phosphors for use in pcLED devices that provide as much emission spectrum under the photopic response curve as possible while still providing suitable color coordinates $CIE_X$ and $CIE_Y$ based on the CIE 1931 Chromaticity Diagram for a given device design.

It has surprisingly been found that conventional substances generically represented by formula (1) exhibit an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, a peak 1 peak wavelength, $P\lambda_{P1}$, and a peak 1 area, $A_{P1}$; wherein the second Gaussian emission curve has a second Gaussian emission curve peak, $P_2$; wherein the second Gaussian emission curve peak, $P_2$, has a peak 2 height, $H_{P2}$, a peak 2 peak wavelength, $P\lambda_{P2}$, a peak 2 area, $A_{P2}$, and a peak 2 full width half max, $FWHM_{P2}$; wherein $P\lambda_{P1} < P\lambda_{P2}$. It is believed that the first Gaussian emission curve and the second Gaussian emission curve correspond to different positions occupied by the $Eu^{2+}$ in the conventional substances generically represented by formula (1). In view of this realization, it becomes apparent that the modification of these substances to provide, at least one of, a minimized peak 2 height, $H_{P2}$; a minimized peak 2 full width at half max, $FWHM_{P2}$; and a minimized peak 2 area, $A_{P2}$, can result in a significant increase in the brightness of the light emitted from the modified substances upon excitation with monochromatic light having a wavelength of 455 nm by maximizing the emission in the region visible to the human eye.

Conventional inorganic substances generically represented by formula (1) are prepared by firing of the constituent raw material powder in a crucible, wherein the internal surfaces of the crucible coming into contact with the raw material powder have previously been seasoned through repeated exposure to a silicon source at high temperatures. Also, conventional substances generically represented by formula (1) exhibit an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, a peak 1 peak wavelength, $P\lambda_{P1}$, and a peak 1 area, $A_{P1}$; wherein the second Gaussian emission curve has a second Gaussian emission curve peak, $P_2$; wherein the second Gaussian emission curve peak, $P_2$, has a peak 2 height, $H_{P2}$, a peak 2 peak wavelength, $P\lambda_{P2}$, a peak 2 area, $A_{P2}$, and a peak 2 full width half max, $FWHM_{P2}$; wherein $P\lambda_{P1} < P\lambda_{P2}$; and, wherein the peak ratio, $P_R$, as determined by the following equation $$P_R = H_{P1}/H_{P2}$$

is <1. It has surprisingly been found that phosphors represented by formula (1) when prepared by firing of the constituent raw material powder in a crucible, wherein the surfaces of the crucible coming into contact with the raw material powder are composed of a virgin metal surface (i.e., a surface that has not been seasoned through repeated exposure to a silicon source at high temperatures) exhibit an overall emission band narrowing with a significant increase in brightness. It is believed that the increase in brightness is due, at least in part, to a structural modification of the phosphor through manipulation of the location and bonding environment of the $Eu^{2+}$ in the crystal structure of the phosphor of the present invention evinced by, at least one of, (i) a reduction in the peak 2 height, $H_{P2}$, relative to the peak 1 height, $H_{P1}$; wherein the peak ratio, $P_R$, is ≥1; (ii) a reduction in the peak 2 full width half max, $FWHM_{P2}$; wherein the $FWHM_{P2} < 100$ nm; and, (iii) a reduction in the peak 2 area, $A_{P2}$, relative to the peak 1 area, $A_{P1}$; wherein the area ratio, $A_R$, is ≥0.6.

Preferably, the phosphor of the present invention, comprises: an inorganic luminescent compound represented by formula (1)

$$M(I)_c M(II)_a Si_5 N_x C_y O_z : Eu^{2+}_b \qquad (1)$$

wherein M(I) is a monovalent species selected from the group consisting of Li, Na, K, F, Cl, Br and I (preferably, Li, Na and F; most preferably, Li and F); wherein M(II) is a divalent cation selected from the group consisting of at least one of Mg, Ca, Sr and Ba (preferably, Ca, Sr and Ba; more preferably, Ca and Sr; most preferably, Sr); wherein 1.7≤a≤2 (preferably, 1.7≤a≤1.999; more preferably, 1.8≤a≤1.995; most preferably, 1.85≤a≤1.97); 0<b≤0.1 (preferably, 0.001≤b≤0.1; more preferably, 0.005≤b≤0.08; most preferably, 0.02≤b≤0.06); 0≤c≤0.1; 5≤x≤8 (preferably, 5.5≤x≤7.8; more preferably, 6≤x≤7.5; most preferably, 6.25≤x≤7.25); 0≤y≤1.5 (preferably, 0.005≤y≤1.5; more preferably, 0.01≤y≤1.25; most preferably, 0.02<y≤0.1); 0≤z≤5 (preferably, 0.005≤z≤5; more preferably, 0.01≤z≤2.5; most preferably, 0.05≤z≤0.5); (preferably, wherein y≠z); wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1} < P\lambda_{P2}$; wherein the emission spectrum, $ES_{455}$, has a peak ratio, $P_R$, of ≥1 (preferably, 1 to 10; more preferably, 1 to 5; most preferably, 1 to 2) as determined by the following equation $$P_R = H_{P1}/H_{P2}.$$

Preferably, the phosphor of the present invention, comprises: an inorganic luminescent compound represented by formula (1)

$$M(I)_c M(II)_a Si_5 N_x C_y O_z : Eu^{2+}_b \qquad (1)$$

wherein M(I) is a monovalent species selected from the group consisting of Li, Na, K, F, Cl, Br and I (preferably, Li, Na and F; most preferably, Li and F); wherein M(II) is a divalent cation selected from the group consisting of Sr and a combination of Sr and at least one of Mg, Ca and Ba (most preferably, wherein M(II) is Sr); wherein 1.7≤a≤2 (preferably, 1.7≤a≤1.999; more preferably, 1.8≤a≤1.995; most preferably, 1.85≤a≤1.97); 0<b≤0.1 (preferably, 0.001≤b≤0.1; more preferably, 0.005≤b≤0.08; most preferably, 0.02<b≤0.06); 0≤c≤0.1; 5≤x≤8 (preferably, 5.5≤x≤7.8; more preferably, 6≤x≤7.5; most preferably, 6.25≤x≤7.25); 0≤y≤1.5 (preferably, 0.005≤y≤1.5; more preferably, 0.01≤y≤1.25; most preferably, 0.02≤y≤0.1); 0≤z≤5 (preferably, 0.005≤z≤5; more preferably, 0.01≤z≤2.5; most preferably, 0.05≤z≤0.5); (preferably, wherein y≠z); wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1} < P\lambda_{P2}$; wherein the emission spectrum, $ES_{455}$, has a peak ratio, $P_R$, of ≥1 (preferably, 1 to 10; more preferably, 1 to 5; most preferably, 1 to 2) as determined by the following equation $$P_R = H_{P1}/H_{P2}.$$

Preferably, the phosphor of the present invention, comprises: an inorganic luminescent compound represented by formula (1)

$$M(I)_c M(II)_a Si_5 N_x C_y O_z:Eu^{2+}_b \qquad (1)$$

wherein M(I) is a monovalent species selected from the group consisting of Li, Na, K, F, Cl, Br and I (preferably, Li, Na and F; most preferably, Li and F); wherein M(II) is a divalent cation selected from the group consisting of Sr and a combination of Sr and at least one of Mg, Ca and Ba (most preferably, wherein M(II) is Sr); wherein $1.7 \leq a \leq 2$ (preferably, $1.7 \leq a \leq 1.999$; more preferably, $1.8 \leq a \leq 1.995$; most preferably, $1.85 \leq a \leq 1.97$); $0 < b \leq 0.1$ (preferably, $0.001 \leq b \leq 0.1$; more preferably, $0.005 \leq b \leq 0.08$; most preferably, $0.02 < b \leq 0.06$); $0 \leq c \leq 0.1$; $5 \leq x \leq 8$ (preferably, $5.5 \leq x \leq 7.8$; more preferably, $6 \leq x \leq 7.5$; most preferably, $6.25 \leq x \leq 7.25$); $0 \leq y \leq 1.5$ (preferably, $0.005 \leq y \leq 1.5$; more preferably, $0.01 \leq y \leq 1.25$; most preferably, $0.02 \leq y \leq 0.1$); $0 \leq z \leq 5$ (preferably, $0.005 \leq z \leq 5$; more preferably, $0.01 \leq z \leq 2.5$; most preferably, $0.05 \leq z \leq 0.5$); wherein $y \neq z$; wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1} < P\lambda_{P2}$; wherein the emission spectrum, $ES_{455}$, has a peak ratio, $P_R$, of $\geq 1$ (preferably, 1 to 10; more preferably, 1 to 5; most preferably, 1 to 2) as determined by the following equation $$P_R = H_{P1}/H_{P2}.$$

Preferably, the phosphor of the present invention exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a peak 1 peak wavelength, $P\lambda_{P1}$; wherein the second Gaussian emission curve has a peak 2 peak wavelength, $P\lambda_{P2}$, and, a full width at half max, $FWHM_{P2}$, of <100 nm (preferably, $\leq 99$ nm; more preferably, $\leq 98$ nm; most preferably, $\leq 97$ nm); wherein $P\lambda_{P1} < P\lambda_{P2}$.

Preferably, the phosphor of the present invention exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a peak 1 peak wavelength, $P\lambda_{P1}$, and a peak 1 area, $A_{P1}$; wherein the second Gaussian emission curve has a peak 2 peak wavelength, $P\lambda_{P2}$, and a peak 2 area, $A_{P2}$; wherein $P\lambda_{P1} < P\lambda_{P2}$; and, wherein the emission spectrum, $ES_{455}$, has an area ratio, $A_R$, of $\geq 0.6$ (preferably, 0.6 to 10; more preferably, 0.6 to 5; most preferably, 0.6 to 1) as determined by the following equation $$A_R = A_{P1}/A_{P2}.$$

Preferably, the phosphor of the present invention exhibits an emission spectrum, $ES_{453}$, upon excitation with monochromatic light having a wavelength of 453 nm; wherein the emission spectrum, $ES_{453}$, has an overall full width at half max, $FWHM_{overall}$, of <90 nm (preferably, <85 nm) coupled with a $CIE_X$ of >0.625 (preferably, >0.627; more preferably, >0.630) based on the CIE 1931 Chromaticity Diagram. More preferably, the phosphor of the present invention exhibits an emission spectrum, $ES_{453}$, upon excitation with monochromatic light having a wavelength of 453 nm; wherein the emission spectrum, $ES_{453}$, has an overall full width at half max, $FWHM_{overall}$, of <90 nm (preferably, <85 nm) coupled with a $CIE_X$ of >0.625 (preferably, >0.627; more preferably, >0.630) based on the CIE 1931 Chromaticity Diagram; and, wherein the phosphor exhibits a high luminescence (preferably, lumens $\geq 210\%$; more preferably, $\geq 220\%$; most preferably, $\geq 225\%$), as measured under the conditions set forth in the Examples.

The phosphor of the present invention can contain impurities. Preferably, the phosphor of the present invention, comprises: $\geq 80$ wt % (more preferably, 80 to 100 wt %; still more preferably 90 to 100 wt %; yet still more preferably 95 to 100 wt %; most preferably 99 to 100 wt %) of the inorganic luminescent compound represented by formula (1); wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$, and a peak 1 area, $A_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$, and a peak 2 area, $A_{P2}$; wherein $P\lambda_{P1} < P\lambda_{P2}$; wherein the emission spectrum, $ES_{455}$, has a peak ratio, $P_R$, of $\geq 1$ (preferably, 1 to 10; more preferably, 1 to 5; most preferably, 1 to 2) as determined by the following equation $$P_R = H_{P1}/H_{P2}; \text{ and,}$$

(preferably, wherein the inorganic luminescent compound further exhibits an area ratio, $A_R$, of $\geq 0.6$).

Preferably, the phosphor of the present invention exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$, and a peak 1 area, $A_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$, and a peak 2 area, $A_{P2}$; wherein $P\lambda_{P1} < P\lambda_{P2}$; and, wherein the emission spectrum, $ES_{455}$, has a peak ratio, $P_R$, of $\geq 1$ (preferably, 1 to 10; more preferably, 1 to 5; most preferably, 1 to 2) as determined by the following equation $$P_R = H_{P1}/H_{P2}$$

(preferably, wherein the inorganic luminescent compound further exhibits an area ratio, $A_R$, of $\geq 0.6$); and, wherein the elements in the inorganic luminescent compound can be in stoichiometric proportions or in non-stoichiometric proportions.

Preferably, the phosphor of the present invention exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$, and a peak 1 area, $A_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$, and a peak 2 area, $A_{P2}$; wherein $P\lambda_{P1} < P\lambda_{P2}$; wherein the emission spectrum, $ES_{455}$, has a peak ratio, $P_R$, of ≥1 (preferably, 1 to 10; more preferably, 1 to 5; most preferably, 1 to 2) as determined by the following equation $$P_R = H_{P1}/H_{P2}$$

(preferably, wherein the inorganic luminescent compound further exhibits an area ratio, $A_R$, of ≥0.6); and, wherein the inorganic luminescent compound represented by formula (1) can be present as at least two different crystalline phases (preferably, wherein the inorganic luminescent compound represented by formula (1) is present as one substantially pure crystalline phase (more preferably, ≥98% of a particular crystalline phase; most preferably, ≥99% of a particular crystalline phase)).

Preferably, the phosphor of the present invention maintains ≥70% (more preferably, ≥85%; most preferably, ≥90%) of its relative emission intensity at temperatures of 25 to 150° C. More preferably, the phosphor of the present invention maintains ≥70% (more preferably, ≥85%; most preferably, ≥90%) of its relative emission intensity at temperatures of 25 to 200° C. Most preferably, the phosphor of the present invention maintains ≥70% (more preferably, ≥85%; most preferably, ≥90%) of its relative emission intensity at temperatures of 25 to 250° C.

Preferably, the phosphor of the present invention exhibits low thermal quenching. More preferably, the phosphor of the present invention exhibits thermal quenching of ≤4% at 150° C. Most preferably, the phosphor of the present invention exhibits thermal quenching of ≤4% at 150° C. and ≤15% at 250° C.

Preferably, the phosphor of the present invention exhibits a median diameter of 2 to 50 microns (more preferably, 4 to 30 microns; most preferably, 5 to 20 microns).

The phosphor of the present invention, optionally, further comprises a surface treatment applied to a surface of the inorganic luminescent compound. Preferably, the surface treatment provides at least one of enhanced stability and enhanced processability. The surface treatment can provide enhanced stability to the inorganic luminescent compound represented by formula (1) by imparting the inorganic luminescent compound with, for example, improved moisture resistance. The surface treatment can provide enhanced processability to the inorganic luminescent compound represented by formula (1) by enhancing the dispersibility of the inorganic luminescent compound in a given liquid carrier. Surface treatments include, for example, polymers (e.g., acrylic resins, polycarbonates, polyamides, polyethylenes and polyorganosiloxanes); metal hydroxides (e.g., magnesium hydroxide, aluminum hydroxide, silicon hydroxide, titanium hydroxide, zirconium hydroxide, tin hydroxide, germanium hydroxide, niobium hydroxide, tantalum hydroxide, vanadium hydroxide, boron hydroxide, antimony hydroxide, zinc hydroxide, yttrium hydroxide, bismuth hydroxide); metal oxides (e.g., magnesium oxide, aluminum oxide, silicon dioxide, titanium oxide, zirconium oxide, tin oxide, germanium oxide, niobium oxide, tantalum oxide, vanadium oxide, boron oxide, antimony oxide, zinc oxide, yttrium oxide, bismuth oxide); metal nitrides (e.g., silicon nitride, aluminum nitride); orthophosphates (e.g., calcium phosphate, barium phosphate, strontium phosphate); polyphosphates; combinations of alkali metal phosphates and alkaline-Earth metal phosphates with calcium salts (e.g., sodium phosphate with calcium nitrate); and, glass materials (e.g., borosilicates, phospho silicates, alkali silicates).

The phosphor of the present invention is, optionally, dispersed in a liquid carrier to form a phosphor composition of the present invention. Preferably, the phosphor composition of the present invention, comprises an inorganic luminescent compound represented by formula (1); and a liquid carrier, wherein the inorganic luminescent compound is dispersed in the liquid carrier. The phosphor composition of the present invention is preferably formulated with a liquid carrier to facilitate at least one of: the storage of the inorganic luminescent compound represented by formula (1) and the manufacture of a lighting apparatus (preferably, a pcLED device). The liquid carrier can be selected to be a fugitive substance (e.g., to be evaporated during processing). The liquid carrier can be selected to be a transformative substance (e.g., to be reacted from a flowable liquid to a non-flowable material).

Fugitive substances suitable for use as liquid carriers include, for example: non-polar solvents (e.g., pentane; cyclopentane; hexane; cyclohexane; benzene; toluene; 1,4-dioxane; chloroform; diethyl ether) and polar aprotic solvents (e.g., dichloromethane; tetrahydrofuran; ethyl acetate; acetone; dimethylformamide; acetonitrile; dimethyl sulfoxide; propylene carbonate).

Transformative liquid carriers suitable for use as liquid carriers include, for example: thermoplastic resins and thermosetting resins that undergo curing upon exposure to at least one of thermal energy and photonic energy. For example, transformative liquid media include: acrylic resins (e.g., (alkyl)acrylates, such as, polymethyl (meth)acrylate); styrene; styrene-acrylonitrile copolymers; polycarbonates; polyesters; phenoxy resins; butyral resins; polyvinyl alcohols; cellulose resins (e.g., ethyl cellulose, cellulose acetate, and cellulose acetate butyrate); epoxy resins; phenol resins; and silicone resins (e.g., polyorganosiloxanes).

The phosphor composition of the present invention, optionally, further comprises: an additive. Preferred additives include a dispersant. Preferably, the dispersant promotes the formation and stabilization of the phosphor composition. Preferred dispersants include, for example, titanium oxides, aluminum oxides, barium titanates and silicon oxides.

The lighting apparatus of the present invention, comprises: at least one light source, wherein the light source produces light having a source luminescence spectrum; and, a first source luminescence spectrum modifier, wherein the first source luminescence spectrum modifier is a phosphor of the present invention; and, wherein the phosphor is radiationally coupled to the light source. The lighting apparatus of the present invention can contain a plurality of light sources.

The light source(s) used in the lighting apparatus of the present invention preferably include light sources that emit light having a peak wavelength, $P\lambda_{source}$, between 200 nm and 600 nm (preferably, between 200 nm and 550 nm; more preferably, between 350 nm and 490 nm). Preferably, the light source used in the lighting apparatus of the present invention is a semiconductor light source. More preferably, the light source used in the lighting apparatus of the present invention is a semiconductor light source selected from GaN based light sources; InGaN based light sources (e.g., $In_iAl_jGa_kN$, where $0 \le i \le 1$, $0 \le j \le 1$, $0 \le k \le 1$, and where $i+j+k=1$); BN based light sources; SiC based light sources; ZnSe based light sources; $B_iAl_jGa_kN$ based light sources, where $0 \le i \le 1$, $0 \le j \le 1$, $0 \le k \le 1$, and where $i+j+k=1$; and, $B_iIn_jAl_kGa_mN$ based light sources, where $0 \le i \le 1$, $0 \le j \le 1$, $0 \le k \le 1$, $0 \le m \le 1$, and where $i+j+k+m=1$. Most preferably, the light source used in the lighting apparatus of the present invention is selected from a GaN based light source and an InGaN based light source; wherein the light source emits light having a peak wavelength, $P\lambda_{source}$, between 200 nm and 600 nm (preferably, between 200 nm and 550 nm; more preferably, between 350 nm and 490 nm; most preferably, between 450 nm and 460 nm).

Preferably, in the lighting apparatus of the present invention, the phosphor of the present invention exhibits an emission spectrum, $ES_{apparatus}$, having a peak wavelength, $P\lambda_{apparatus}$, of between 600 nm and 660 nm (preferably, between 610 nm and 640 nm; more preferably, between 615 nm and 630 nm; most preferably, between 620 nm and 630 nm) upon exposure to the source luminescence spectrum produced by the light source.

The lighting apparatus of the present invention, optionally, further comprises: a second source luminescence spectrum modifier, wherein the second source luminescence spectrum modifier comprises at least one additional phosphor, wherein the at least one additional phosphor is radiationally coupled to at least one of the light source and the first source luminescence spectrum modifier. Preferably, the second source luminescence spectrum modifier is at least one additional phosphor selected from the group consisting of red emitting phosphors, blue emitting phosphors, yellow emitting phosphors, green emitting phosphors and combinations thereof. Preferably, the second source luminescence spectrum modifier is at least one additional phosphor interposed between the light source and the first luminescence spectrum modifier.

Preferably, the lighting apparatus of the present invention comprises at least two phosphors, wherein at least one of the phosphors is a phosphor of the present invention. The at least two phosphors can be intermixed in one matrix. Alternatively, the at least two phosphors can be dispersed separately such that the phosphors can be superimposed in layers instead of dispersing the phosphors together in a single matrix. The layering of the phosphors can be used to obtain a final light emission color by way of a plurality of color conversion processes.

Some embodiments of the present invention will now be described in detail in the following Examples.

Comparative Examples C1-C6 and Examples 1-7

Preparation of Inorganic Luminescent Compounds

Comparative Examples C1-C6

The inorganic luminescent compound, generically represented by formula (1), in each of the Comparative Examples C1-C6 was prepared by a solid state reaction with the starting materials identified in TABLE 1. The starting materials were provided in powder form, were weighed out, physically mixed together and ground with a mortar and pestle in a glove box under a dried nitrogen atmosphere to form a uniform powder mixture. The powder mixture was then loaded in a crucible conventionally seasoned through repeated exposure to silicon sources at high temperature to form a metal silicide surface layer on the powder contacting surface of the crucible. The loaded crucible was then placed in a high temperature furnace under a flowing, high purity nitrogen/hydrogen ($N_2/H_2$) atmosphere. The powder mixture was then heated at a temperature of 1500 to 1850° C. for 8 to 12 hours in a high temperature furnace under the flowing $N_2/H_2$ atmosphere. The resulting powder was removed from the crucible, ground using a mortar and pestle under a dried nitrogen atmosphere to form a uniform powder mixture. The powder mixture was then reloaded into the crucible. The loaded crucible was then placed in the high temperature furnace under a flowing, high purity $N_2/H_2$ atmosphere and heated at a temperature of 1500 to 1850° C. for another 8 to 12 hours under the flowing $N_2/H_2$ atmosphere. The resulting powder was then removed from the crucible, ground using a mortar and pestle under a dried nitrogen atmosphere forming a uniform powder mixture. This powder mixture was then reloaded into the crucible. The loaded crucible was again placed in the high temperature furnace under a flowing, high purity $N_2/H_2$ atmosphere and heated at a temperature of 1500 to 1850° C. for another 8 to 12 hours under the flowing $N_2/H_2$ atmosphere. The resulting powder was then removed from the firing crucible, ground using a mortar and pestle, washed with acid and deionized water at room temperature, milled and then sieved using a 100 to 400 U.S. standard mesh to provide the inorganic luminescent compound.

Examples 1-7

The inorganic luminescent compound represented by formula (I), in each of the Examples 1-11 was prepared by a solid state reaction with the starting materials identified in TABLE 1. The starting materials noted in TABLE 1 were provided in powder form. All of the starting materials were physically mixed together and ground using a mortar and pestle in a glove box under a dried nitrogen atmosphere to form a uniform powder mixture. The powder mixture was then loaded into a crucible, wherein the powder contacting surface of the crucible was virgin molybdenum (i.e., the powder contacting surface of the crucibles used in each of Examples 1-7 was not seasoned through high temperature exposure to silicon prior to use in Examples 1-7). The loaded crucible was then placed in a high temperature furnace under a flowing, high purity nitrogen/hydrogen atmosphere. The powder mixture was then heated at a temperature of 1500 to 1850° C. for 8 to 12 hours in a high temperature furnace under the flowing $N_2/H_2$ atmosphere. The resulting powder was removed from the crucible, ground using a mortar and pestle to form a uniform powder mixture. The resulting powder mixture was then reloaded into the crucible. The loaded crucible was placed back in the high temperature furnace under the flowing $N_2/H_2$ atmosphere and heated at a temperature of 1500 to 1850° C. for another 8 to 12 hours under the flowing $N_2/H_2$ atmosphere. The resulting powder was then removed from the crucible, ground using a mortar and pestle, washed with acid and deionized water at room temperature, milled, and then sieved using a 100 to 400 U.S. standard mesh to provide the inorganic luminescent compound.

TABLE 1

| Ex # | $Sr_3N_2$ (g) | $Si_3N_4$ (g) | $Eu_2O_3$ (g) | SiC (g) |
|---|---|---|---|---|
| C1 | 143.227 | 147.650 | 5.247 | 14.067 |
| C2 | 143.227 | 147.650 | 5.247 | 14.067 |
| C3 | 143.227 | 147.650 | 5.247 | 14.067 |
| C4 | 143.365 | 147.688 | 5.064 | 14.071 |
| C5 | 143.365 | 147.688 | 5.064 | 14.071 |
| C6 | 143.365 | 147.688 | 5.064 | 14.071 |
| 1 | 143.090 | 147.612 | 5.431 | 14.064 |
| 2 | 143.090 | 147.612 | 5.431 | 14.064 |
| 3 | 143.090 | 147.612 | 5.431 | 14.064 |
| 4 | 143.090 | 147.612 | 5.431 | 14.064 |
| 5 | 143.090 | 147.612 | 5.431 | 14.064 |
| 6 | 143.090 | 147.612 | 5.431 | 14.064 |
| 7 | 143.090 | 147.612 | 5.431 | 14.064 |

Inorganic Luminescent Compound Properties

The product inorganic luminescent compounds were subjected to elemental analysis to determine that their $Eu^{2+}$ concentrations were equivalent, such that the significant increase in the brightness of the light emitted from the inorganic luminescent compounds of the present invention (as compared to the comparative formulations) upon excitation with monochromatic light having a wavelength of 455 nm is attributable to an increase in the emission spectrum, $ES_{455}$, from the inorganic luminescent compound that occurs in the photopic reduction region, by at least one of, (i) a minimization of the peak 2 height, $H_{P2}$, relative to the peak 1 height, $H_{P1}$, such that the height ratio, $H_R$, is 1 to 2; (ii) a minimization of the peak 2 full width at half max, $FWHM_{P2}$, of <100 nm; and, (iii) a minimization of the peak 2 area, $A_{P2}$, relative to the peak 1 area, $A_{P1}$, such that the area ratio, $A_R$, is ≥0.6.

The emission spectrum, $ES_{453}$, exhibited by each of the inorganic luminescent compounds upon excitation with a light source (i.e., a light emitting diode (LED) lamp peaking at 453 mm was analyzed using an Ocean Optics USB4000 spectrometer available from Ocean Optics). The peak wavelength, $P\lambda_{overall}$, and the overall full width half maximum, $FWHM_{overall}$, determined from the emission spectrum, $ES_{453}$, for each inorganic luminescent compound are reported in TABLE 2.

The emission spectrum, $ES_{453}$, color coordinates $CIE_X$ and $CIE_Y$ based on the CIE 1931 Chromaticity Diagram were calculated for each of the inorganic luminescent compounds from the emission spectrum in the 380-780 nm wavelength range when excited by the emission from the LED light source. The color coordinates determined for the inorganic luminescent compounds are reported in TABLE 2.

The internal quantum efficiency for each of the inorganic luminescent compounds was determined by taking a sample of the inorganic luminescent compound packed into a cell, mounting the cell in an integrating sphere and then exposing the inorganic luminescent compound to light emitted from a light source. Specifically, the light from the light source was guided through an optical tube, filtered through a narrow band pass filter to provide monochromatic light with a wavelength of 453 nm that was then directed at the inorganic luminescent compound. The spectrum of light emitted from the inorganic luminescent compound in the integrating sphere upon excitation with the light from the light source and the light reflected by the inorganic luminescent compound were measured with an Ocean Optics USB 4000 spectrometer available from Ocean Optics. The conversion efficiencies (QE and Emission) and are reported relative to an internal standard. The luminous flux (lumens) was calculated for each of the materials from the emission spectrum, $ES_{453}$, in the 500-780 nm wavelength range when excited by the emission from the 453 nm LED light source and reported relative to an internal standard. Each of these values is reported in TABLE 2.

TABLE 2

| Ex # | $CIE_X$ | $CIE_Y$ | $FWHM_{overall}$ (nm) | $P\lambda_{overall}$ (nm) | Lumens (%) | QE (%) | Emission (%) |
|---|---|---|---|---|---|---|---|
| C1 | 0.635 | 0.364 | 88 | 623 | 201 | 104 | 117 |
| C2 | 0.634 | 0.365 | 87 | 622 | 206 | 104 | 118 |
| C3 | 0.634 | 0.365 | 87 | 623 | 205 | 104 | 117 |
| C4 | 0.639 | 0.36 | 90 | 626 | 186 | 97 | 113 |
| C5 | 0.637 | 0.362 | 92 | 626 | 187 | 102 | 114 |
| C6 | 0.637 | 0.363 | 92 | 626 | 188 | 103 | 114 |
| 1 | 0.628 | 0.371 | 80 | 618 | 238 | 105 | 118 |
| 2 | 0.629 | 0.371 | 80 | 618 | 237 | 105 | 118 |
| 3 | 0.629 | 0.371 | 80 | 618 | 232 | 103 | 116 |
| 4 | 0.628 | 0.372 | 80 | 618 | 238 | 105 | 118 |
| 5 | 0.627 | 0.373 | 80 | 618 | 243 | 108 | 119 |
| 6 | 0.632 | 0.367 | 83 | 620 | 221 | 103 | 117 |
| 7 | 0.632 | 0.367 | 83 | 620 | 221 | 103 | 118 |

The emission spectrum, $ES_{455}$, exhibited by each of the inorganic luminescent compounds upon excitation with a light source (a 455 nm monochromatic laser) was further analyzed using a spectrometer having a spectral resolution of 1.5 nm. The emission spectrum, $ES_{455}$, exhibited by each of the inorganic luminescent compounds upon excitation with the 455 nm monochromatic laser were individually fitted using the GRAMS peak fitting approach using an automated MATLAB routine with 2 Gaussian bands to provide the data reported in TABLE 3 for each of the inorganic luminescent compounds. Note that the data reported in TABLE 3 is the average derived from the analysis of duplicate samples of the inorganic luminescent compounds.

TABLE 3

| Ex. | $H_{P1}$ (counts) | $H_{P2}$ (counts) | $P_R$ | $A_{P1}$ (area counts) | $A_{P2}$ (area counts) | $A_R$ | $FWHM_{P2}$ (nm) | $P\lambda_{P1}$ (nm) | $P\lambda_{P2}$ (nm) |
|---|---|---|---|---|---|---|---|---|---|
| C1 | 13547 | 15116 | 0.90 | 825813 | 1624486 | 0.51 | 100.93 | 611 | 644 |
| C2 | 60952 | 65361 | 0.93 | 3797007 | 7034778 | 0.54 | 100.98 | 611 | 643 |
| C3 | 33748 | 36217 | 0.93 | 2078345 | 3890430 | 0.53 | 100.89 | 611 | 643 |
| C4 | 5753 | 6215 | 0.93 | 349243 | 675636 | 0.52 | 102.13 | 614 | 646 |
| C5 | 12370 | 14186 | 0.87 | 760791 | 1562385 | 0.49 | 103.42 | 614 | 645 |
| C6 | 12858 | 15835 | 0.81 | 765238 | 1734731 | 0.44 | 102.92 | 613 | 645 |
| 1 | 9623 | 7863 | 1.22 | 589674 | 807836 | 0.73 | 96.52 | 610 | 640 |
| 2 | 6291 | 5267 | 1.19 | 382523 | 541721 | 0.71 | 96.62 | 610 | 640 |
| 3 | 19666 | 15449 | 1.27 | 1224946 | 1586536 | 0.77 | 96.48 | 610 | 640 |
| 4 | 6414 | 5238 | 1.22 | 390296 | 536812 | 0.73 | 96.28 | 610 | 640 |
| 5 | 6003 | 4791 | 1.25 | 370521 | 492514 | 0.75 | 96.57 | 610 | 640 |
| 6 | 9559 | 8656 | 1.10 | 585053 | 904371 | 0.65 | 98.15 | 611 | 642 |
| 7 | 19018 | 17227 | 1.10 | 1172094 | 1806058 | 0.65 | 98.48 | 611 | 642 |

We claim:

1. A phosphor, comprising:
an inorganic luminescent compound represented by formula (1)

$$M(I)_c M(II)_a Si_5 N_x C_y O_z : Eu^{2+}_b \quad (1)$$

wherein M(I) is a monovalent species selected from the group consisting of Li, Na, K, F, Cl, Br and I;

wherein M(II) is a divalent cation selected from the group consisting of at least one of Mg, Ca, Sr and Ba;

wherein $1.7 \leq a \leq 2$; $0 < b \leq 0.1$; $0 \leq c \leq 0.1$; $5 \leq x \leq 8$; $0 \leq y \leq 1.5$; $0 \leq z \leq 5$;

wherein the phosphor exhibits an emission spectrum, $ES_{455}$, upon excitation with monochromatic light having a wavelength of 455 nm; wherein the emission spectrum, $ES_{455}$, is resolvable into a first Gaussian emission curve and a second Gaussian emission curve; wherein the first Gaussian emission curve has a first Gaussian emission curve peak, $P_1$; wherein the first Gaussian emission curve peak, $P_1$, has a peak 1 height, $H_{P1}$, at a peak 1 peak wavelength, $P\lambda_{P1}$; wherein the second Gaussian emission curve has a second Gaussian emission curve peak, $P_2$; wherein the second Gaussian emission curve peak, $P_2$, has a peak 2 height, $H_{P2}$, at a peak 2 peak wavelength, $P\lambda_{P2}$; wherein $P\lambda_{P1} < P\lambda_{P2}$; wherein the emission spectrum, $ES_{455}$, has a peak ratio, $P_R$, of $\geq 1$ as determined by the following equation $P_R = H_{P1}/H_{P2}$.

2. The phosphor of claim 1, wherein the second Gaussian emission curve has a full width at half max, $FWHM_{P2}$, of <100 nm.

3. The phosphor of claim 1, wherein the first Gaussian emission curve has a peak 1 area, $A_{P1}$, and the second Gaussian emission curve has a peak 2 area, $A_{P2}$; wherein the emission spectrum, $ES_{455}$, has an area ratio, $A_R$, of $\geq 0.6$ as determined by the following equation $A_R = A_{P1}/A_{P2}$.

4. The phosphor of claim 1, wherein $0.01 \leq y \leq 1.5$; $0.01 \leq z \leq 5$; and, $y \neq z$.

5. The phosphor of claim 4, wherein M(II) is Sr.

6. The phosphor of claim 1, wherein the phosphor exhibits an emission spectrum, $ES_{453}$, upon excitation with monochromatic light having a wavelength of 453 nm; wherein the emission spectrum, $ES_{453}$, has an overall full width at half max, $FWHM_{overall}$, of <90 nm coupled with a $CIE_X$ of >0.625 based on the CIE 1931 Chromaticity Diagram.

7. The phosphor of claim 1, further comprising a surface treatment; wherein the surface treatment is applied to a surface of the inorganic luminescent compound.

8. A phosphor composition, comprising: a phosphor according to claim 1; and, a liquid carrier; wherein the phosphor is dispersed in the liquid carrier.

9. A lighting apparatus comprising:
a light source, wherein the light source produces light having a source luminescence spectrum; and,
a first source luminescence spectrum modifier, wherein the first source luminescence spectrum modifier is a phosphor according to claim 1;
wherein the phosphor is radiationally coupled to the light source.

10. The light apparatus of claim 9, further comprising at least one additional phosphor.

* * * * *